United States Patent
Smith et al.

(10) Patent No.: US 8,969,928 B2
(45) Date of Patent: Mar. 3, 2015

(54) TRANSISTORS HAVING A CONTROL GATE AND ONE OR MORE CONDUCTIVE STRUCTURES

(75) Inventors: Mike Smith, Boise, ID (US); Henry Jim Fulford, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 418 days.

(21) Appl. No.: 12/872,814

(22) Filed: Aug. 31, 2010

(65) Prior Publication Data
US 2012/0049248 A1 Mar. 1, 2012

(51) Int. Cl.
| | | |
|---|---|---|
| H01L 29/78 | (2006.01) | |
| H01L 21/265 | (2006.01) | |
| H01L 29/423 | (2006.01) | |
| H01L 29/66 | (2006.01) | |
| H01L 29/06 | (2006.01) | |
| H01L 29/10 | (2006.01) | |

(52) U.S. Cl.
CPC ...... *H01L 21/26586* (2013.01); *H01L 29/4238* (2013.01); *H01L 29/42372* (2013.01); *H01L 29/66484* (2013.01); *H01L 29/0607* (2013.01); *H01L 29/1045* (2013.01); *H01L 29/7833* (2013.01)
USPC ............ 257/288; 257/487; 257/488; 257/491

(58) Field of Classification Search
CPC .................. H01L 29/66484; H01L 29/42328; H01L 29/42332; H01L 29/7831; H01L 21/823437; H01L 21/823456; H01L 29/404; H01L 29/4232; H01L 29/42372; H01L 29/4983; H01L 29/4238
USPC ................... 257/288, 487, 488, 491, E29.255
See application file for complete search history.

(56) References Cited

U.S. PATENT DOCUMENTS

| | | | | |
|---|---|---|---|---|
| 4,804,568 A | * | 2/1989 | Ohsawa et al. | 428/40.9 |
| 4,880,663 A | * | 11/1989 | Shimada | 427/96.4 |
| 4,880,683 A | * | 11/1989 | Stow | 428/200 |
| 5,021,999 A | * | 6/1991 | Kohda et al. | 365/185.03 |
| 5,458,967 A | * | 10/1995 | Kanno et al. | 428/344 |
| 5,687,113 A | * | 11/1997 | Papadas et al. | 365/185.01 |
| 5,709,957 A | * | 1/1998 | Chiang et al. | 428/615 |
| 5,714,786 A | * | 2/1998 | Gonzalez et al. | 257/366 |
| 5,955,765 A | * | 9/1999 | Yamazaki et al. | 257/365 |
| 6,005,273 A | * | 12/1999 | Gonzalez et al. | 257/366 |

(Continued)

FOREIGN PATENT DOCUMENTS

| | | | | |
|---|---|---|---|---|
| EP | 1 615 228 A1 | * | 1/2006 | G11C 16/04 |
| JP | 62-265765 | * | 11/1987 | H01L 29/78 |

OTHER PUBLICATIONS

English abstract of JP 62-265765, Shimazu, Nov. 1987, Derwent, 1 page.*

(Continued)

*Primary Examiner* — Evan Pert
(74) *Attorney, Agent, or Firm* — Dicke, Billig & Czaja, PLLC (57) ABSTRACT

Transistors having a dielectric over a semiconductor, a control gate over the dielectric at a particular level, and one or more conductive structures over the dielectric at the particular level facilitate control of device characteristics of the transistor. The one or more conductive structures are between the control gate and at least one source/drain region of the transistor. The one or more conductive structures are electrically isolated from the control gate.

33 Claims, 8 Drawing Sheets

(56) References Cited

U.S. PATENT DOCUMENTS

| | | | | |
|---|---|---|---|---|
| 6,158,268 | A * | 12/2000 | Hafele et al. | 73/31.05 |
| 6,248,401 | B1 * | 6/2001 | Chiang et al. | 427/96.8 |
| 6,528,404 | B2 * | 3/2003 | Kim | 438/596 |
| 6,737,700 | B1 * | 5/2004 | Chang et al. | 257/315 |
| 6,884,936 | B2 * | 4/2005 | Takahashi et al. | 174/389 |
| 6,917,068 | B1 * | 7/2005 | Krivokapic | 257/314 |
| 7,148,540 | B2 * | 12/2006 | Shibib et al. | 257/336 |
| 7,217,624 | B2 * | 5/2007 | Lim et al. | 438/302 |
| 7,811,886 | B2 * | 10/2010 | Winstead et al. | 438/261 |
| 7,910,441 | B2 * | 3/2011 | Yang et al. | 438/275 |
| 8,125,076 | B2 * | 2/2012 | Kim et al. | 257/707 |
| 8,183,096 | B2 * | 5/2012 | Wirbeleit | 438/142 |
| 8,691,393 | B2 * | 4/2014 | Cook et al. | 428/458 |
| 2007/0210711 | A1 * | 9/2007 | Cha | 313/582 |
| 2012/0012382 | A1 * | 1/2012 | McBain et al. | 174/388 |
| 2013/0133941 | A1 * | 5/2013 | Cook et al. | 174/388 |

OTHER PUBLICATIONS

Smith, et al.; "Transistors With an Extension Region Having Strips of Differing Conductivity Type and Methods of Forming the Same"; U.S. Appl. No. 12/639,158, filed Dec. 16, 2009; Total pp. 24.

\* cited by examiner

TRANSISTORS HAVING A CONTROL GATE AND ONE OR MORE CONDUCTIVE STRUCTURES

TECHNICAL FIELD

The present disclosure relates generally to semiconductor devices and, in particular, in one or more embodiments, the present disclosure relates to transistors.

BACKGROUND

Transistors, such as field effect transistors (FETs), having high breakdown voltages (e.g., above about 15 to about 80 volts or greater) are used in various applications, such as power management or amplification and for driver systems. For example, the breakdown voltage may be defined as the voltage at which the drain (or source) breaks down while the transistor is turned off. In addition, transistors having high breakdown voltages may be used on the periphery of a memory device. For example, these transistors can be located between charge pumps and the string drivers of a memory device that provide voltages to the access lines (e.g., word lines) and can be used in charge pump circuitry and for the string drivers.

One technique for creating transistors with high breakdown voltages uses a lightly doped region between a source/drain region and the control gate of the transistor. This region is sometimes referred to as a drain extension region.

Aside from device geometry, breakdown voltage of such transistors can be dependent upon doping levels between the source/drain region and the control gate. This region between the source/drain region and the control gate is sometimes conductively doped at the same time as doping of the source/drain region itself because doping these regions separately add process steps and thus fabrication costs. However, doping levels desirable for contacts to the source/drain region may not lead to desirable breakdown voltages.

For the reasons stated above, and for other reasons stated below which will become apparent to those skilled in the art upon reading and understanding the present specification, there is a need in the art for alternative transistor structures.

DETAILED DESCRIPTION

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The term semiconductor can refer to, for example, a layer of material, a wafer, or a substrate, and includes any base semiconductor structure. "Semiconductor" is to be understood as including silicon on sapphire (SOS) technology, silicon on insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure. The following detailed description is, therefore, not to be taken in a limiting sense.

Various embodiments include transistors having a dielectric over a semiconductor, a control gate over the dielectric at a particular level, and one or more conductive structures over the dielectric at the particular level. The one or more conductive structures are between the control gate and at least one source/drain region of the transistor. The one or more conductive structures are electrically isolated from the control gate.

Figure 1A:
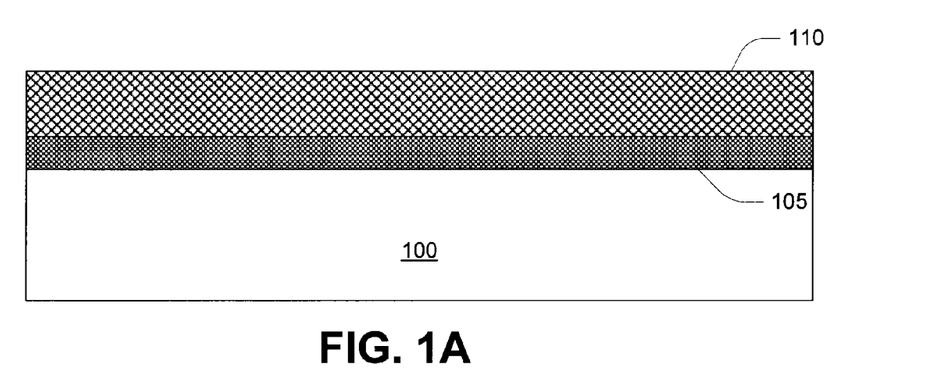
FIGS. 1A-1G are cross-sectional views of a transistor at various stages of fabrication in accordance with an embodiment of the disclosure.
Figure 1B:
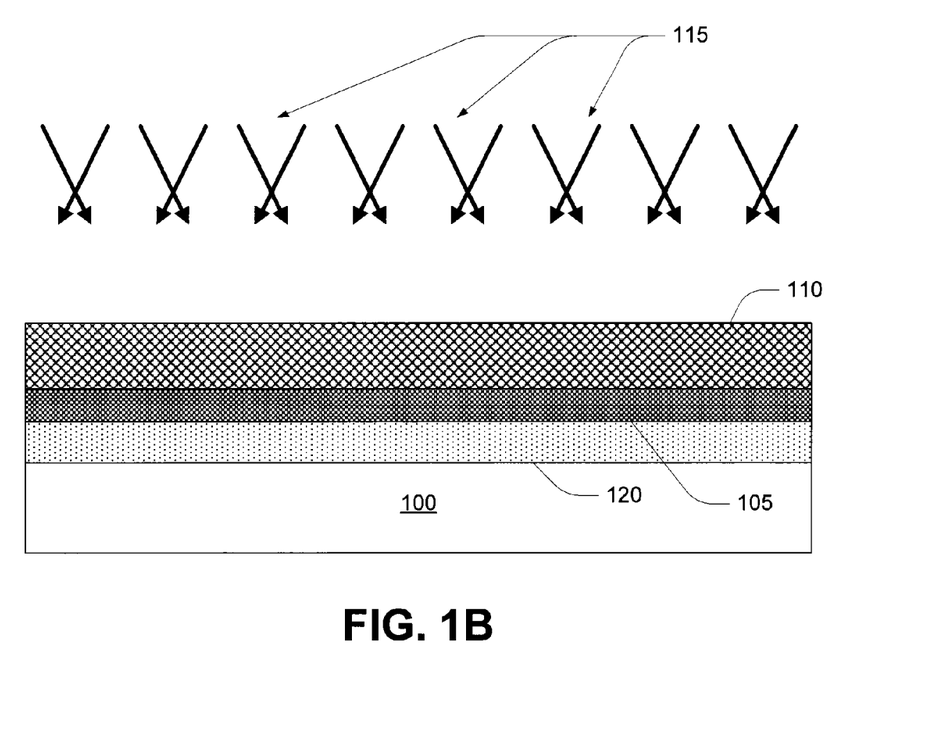
Figure 1C:
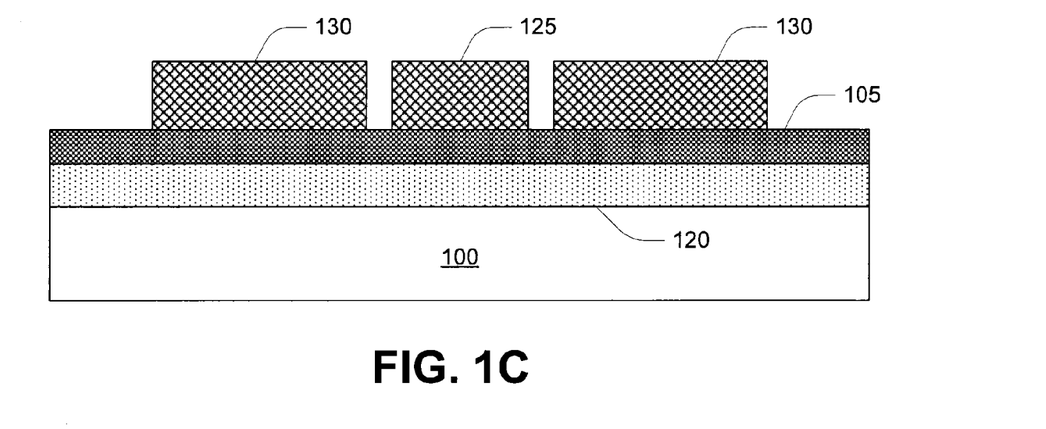
Figure 1D:
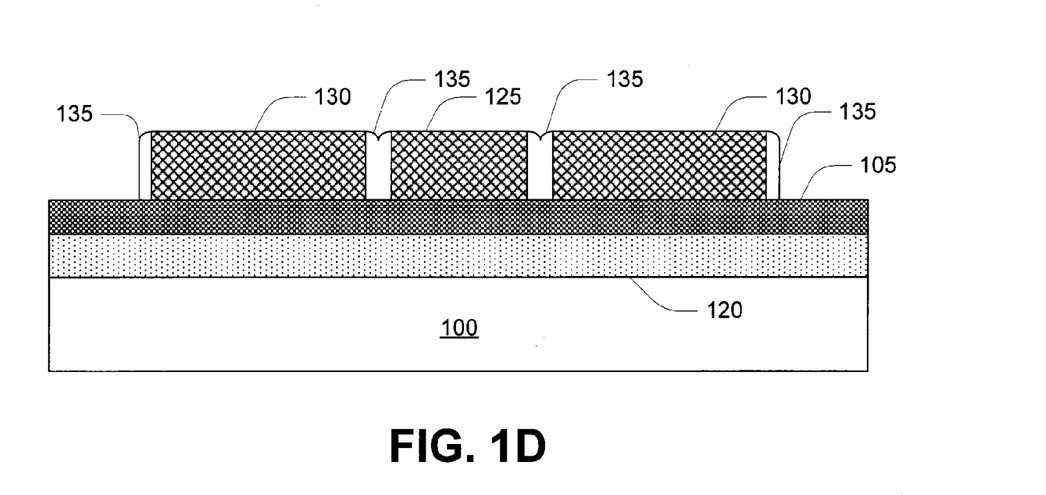
Figure 1E:
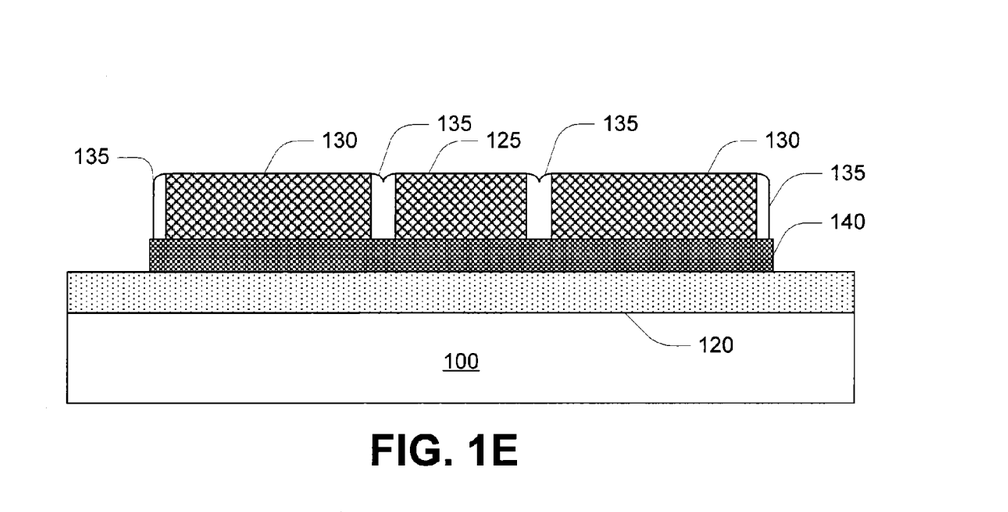
Figure 1F:
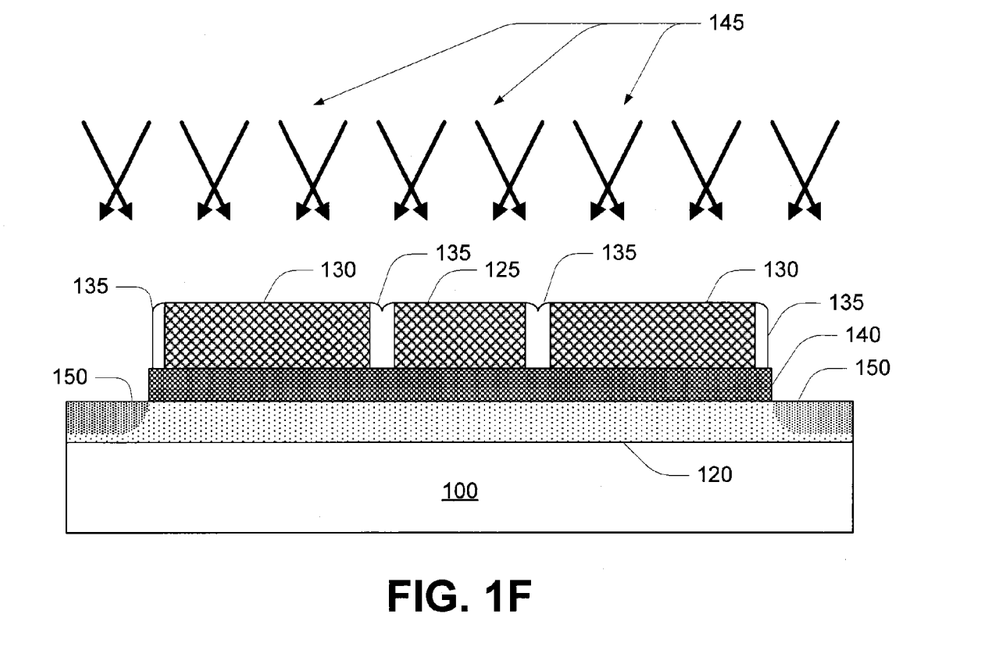
Figure 1G:
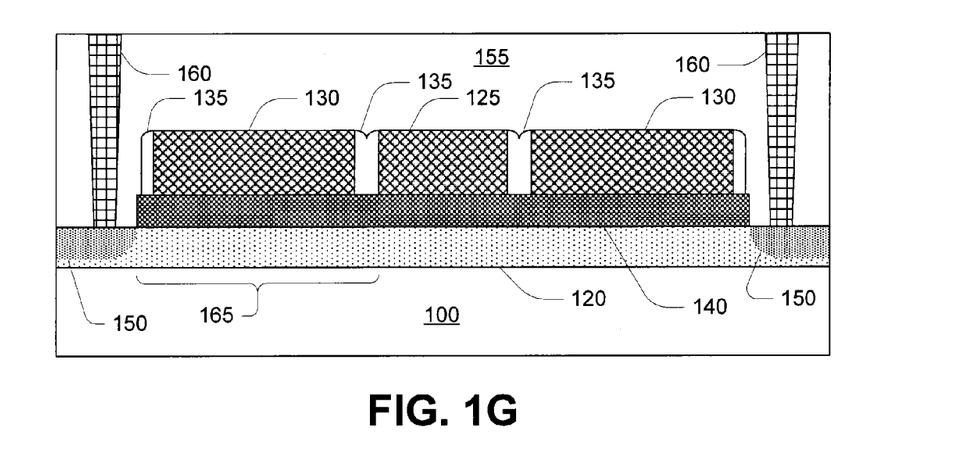
Figure 1H:
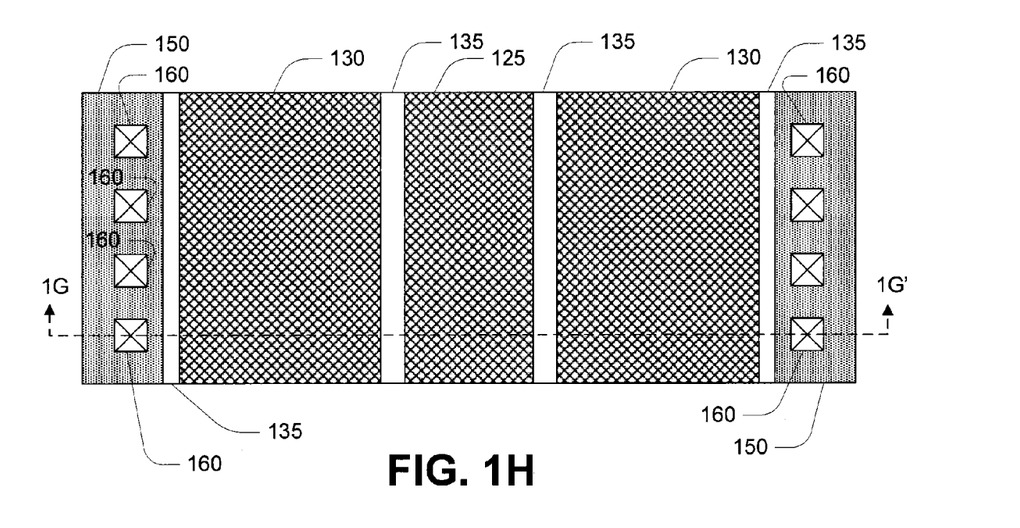
FIG. 1H is a top view of the transistor of FIG. 1G.

FIGS. 1A-1G depict cross-sectional views of a transistor during various stages of fabrication taken along view line 1G-1G' of FIG. 1H in accordance with an embodiment. FIG. 1A depicts a semiconductor 100 upon which the transistor will be formed. For one embodiment, the semiconductor 100 is a monocrystalline silicon. For a further embodiment, semiconductor 100 is a conductively-doped monocrystalline silicon. Other embodiments may include amorphous silicon, polycrystalline silicon (commonly referred to as polysilicon), or other semiconductor materials. Semiconductor 100 may be conductively doped to a first conductivity type, e.g., a p-type conductivity. Doping is often performed through ion implantation techniques. Dopant sources for ion implantation techniques are often fluorine-based gases. For example, in the ion implantation of boron ions to achieve a p-type conductivity, the source gas may be boron trifluoride ($BF_3$). Thermal processing may be performed following the implantation in order to diffuse the ions and to repair surface damage caused by the ion bombardment. In addition to ion implantation techniques, other doping methods are known such as diffusion techniques using gaseous, liquid or solid dopant sources. Examples of dopant sources for the diffusion of boron include gaseous diborane ($B_2H_6$), liquid boron tribromide ($BBr_3$) and solid boron nitride (BN). Other dopant sources and specific techniques are well known in the art of semiconductor fabrication.

As further depicted in FIG. 1A, a dielectric 105 and a conductor 110 have been formed on the semiconductor 100. These elements will form the gate dielectric and control gate of the future transistor.

Formation of the structure of FIG. 1A can include formation of the dielectric 105 over an active region of the semiconductor 100, e.g., an area over which active integrated circuit devices will be formed. For example, the active region of the semiconductor 100 may include a conductively-doped well of a semiconductor wafer. The dielectric 105 is generally one or more dielectric materials. The dielectric 105 might be formed, for example, by thermal oxidation of the semiconductor 100. Alternatively, the dielectric 105 could be formed by a blanket deposition of a dielectric material, such as by chemical vapor deposition (CVD), physical vapor deposition (PVD) or atomic layer deposition (ALD). Example dielectric materials for dielectric 105 include silicon oxides ($SiO_x$), silicon nitride ($SiN_x$), silicon oxynitrides ($SiO_xN_y$), aluminum oxides ($AlO_x$), hafnium oxides ($HfO_x$), hafnium aluminum oxides ($HfAlO_x$), lanthanum oxides ($LaO_x$), tantalum oxides ($TaO_x$), zirconium oxides ($ZrO_x$), zirconium aluminum oxides ($ZrAlO_x$), etc., and combinations thereof.

The conductor 110 is formed over the dielectric 105. In general, the conductor 110 includes one or more conductive materials. For one embodiment, the conductor 110 contains a conductively-doped polysilicon. For another embodiment, the conductor 110 contains a metal-containing material. For a further embodiment, the conductor 110 includes a metal-containing material over polysilicon, e.g., a refractory metal silicide formed on a conductively-doped polysilicon. The metals of chromium (Cr), cobalt (Co), hafnium (Hf), molybdenum (Mo), niobium (Nb), tantalum (Ta), titanium (Ti), tungsten (W), vanadium (V), zirconium (Zr), and metal nitrides (including, for example, titanium nitride, tantalum nitride, tantalum carbon nitride, tungsten nitride) for metal gates are generally recognized as refractory metal materials. For another embodiment, the conductor 110 contains multiple metal-containing materials, e.g., a titanium nitride (TiN) barrier over the dielectric 105, titanium (Ti) as an adhesion material over the barrier, and tungsten (W) over the adhesion material.

In FIG. 1B, a doped region 120, may be formed in the semiconductor 100 below the dielectric 105. The doped region 120 will form the body of the future transistor, and may be referred to herein alternately as the body 120. For one embodiment, the doped region 120 is formed through implantation of a dopant species, depicted by arrows 115. The dopant species 115 may have a conductivity type different than the conductivity type of the semiconductor 100. For example, where the semiconductor 100 has a p-type conductivity, the doped region 120 may have an n-type conductivity. Example dopant species 115 for an n-type conductivity include compounds or ions of antimony (Sb), arsenic (As) and phosphorus (P). While FIG. 1B depicts an angled implant of the dopant species 115, such is not necessary. As is well understood, control of the power of the implant can be used to determine a depth of the dopant species 115 within the semiconductor 100, thus allowing the doped region 120 to be localized below the dielectric 105.

In FIG. 1C, the conductor 110 is patterned to define the control gate 125 of the transistor and one or more conductive structures 130. For example, photolithographic techniques may be used to define the control gate 125 and the conductive structures 130.

The control gate 125 and the conductive structures 130 are at a particular level over the dielectric 105. Elements occurring at a particular level, as used herein, does not require that the elements be the same distance from some reference point, such as a surface of the semiconductor 100. Instead, this will refer to a stage of fabrication, such that elements formed on the same preceding structure (e.g., the control gate 125 and conductive structures 130 of FIG. 1C are each formed to be in contact with the dielectric 105), or elements formed concurrently, will be deemed to be formed at the same level.

In FIG. 1D, spacers 135 are formed. Spacers 135 generally contain one or more dielectric materials. Example dielectric materials include a silicon oxide ($SiO/SiO_2$), silicon nitride ($SiN/Si_2N/Si_3N_4$) or silicon oxynitride (SiOxNy) material. Other dielectric materials are known and used in the art of semiconductor fabrication. In general, the dielectric material of spacers 135 should be chosen to generally inhibit current flow between the control gate 125 and the one or more conductive structures 130, and to inhibit subsequent doping as described with reference to FIG. 1F. As one example, spacers 135 may be formed by performing a blanket deposition of dielectric material over the structure of FIG. 1C, followed by an anisotropic removal (e.g., anisotropic reactive ion etch removal) of the dielectric material from the horizontal surfaces.

In FIG. 1E, portions of the dielectric 105 are removed to define the gate dielectric 140 of the future transistor. In FIG. 1F, source/drain regions 150 are formed. Source/drain regions 150 have the same conductivity type as the body 120, but at a higher level of doping. For one embodiment, the source/drain regions 150 are formed through implantation of a dopant species, depicted by arrows 145. The dopant species 145 and power of the implantation for the source/drain regions 150 should be chosen such that the dopant species 145 does not penetrate into the body 120 below the control gate 125, the conductive structures 130 or the spacers 135. In general, breakdown voltage of the future transistor can be improved by providing a doped region between the control gate 125 and the source/drain regions 150 having a conductivity level less than the source/drain regions 150. The use of the conductive structures 130 and spacers 135 can serve to limit the amount of dopant species 145 entering the body 120, thereby maintaining this portion of the body 120 at a conductivity level less than the source/drain regions 150.

In FIG. 1G, bulk dielectric 155 is formed over the structure of FIG. 1F. Bulk dielectric 155 generally is formed of one or more dielectric materials. For one embodiment, bulk dielectric 155 is a doped silicon oxide material, such as borophosphosilicate glass (BPSG), a boron- and phosphorous-doped silicon dioxide material.

Contacts 160, including one or more conductive materials, are formed to be in electrical contact with the source/drain regions 150 through the bulk dielectric 155. For example, vias may be formed in the bulk dielectric 155 to expose portions of the source/drain regions 150, and then the vias may be filled with conductive material. For one embodiment, the contacts 160 contain a metal-containing material. For a further embodiment, the contacts 160 include a metal-containing material over polysilicon, e.g., a refractory metal silicide formed on a conductively-doped polysilicon. For another embodiment, the contacts 160 contain multiple metal-containing materials, e.g., a titanium nitride (TiN) barrier over the source/drain region 150, titanium (Ti) as an adhesion material over the barrier, and tungsten (W) over the adhesion material. Although not shown in the figures, one or more contacts may be formed to be in electrical contact with the control gate 125 for application of gate potentials.

The portion of the body 120 between the control gate 125 and a source/drain region 150 defines a drain extension region 165. The resulting structure of FIG. 1G is a depletion mode field-effect transistor. The drain extension region 165 generally having a conductivity level less than the conductivity level of its associated source/drain region 150 facilitates improvement in the breakdown voltage of the transistor.

For one or more embodiments, the conductive structures 130 are not only isolated from the control gate 125, but are also electrically floating. For one or more alternative embodiments, one or more of the conductive structures 130 may be configured to receive a bias potential to act as a field plate of the transistor. In this manner, the effective conductivity level of the drain extension region 165 can be altered through the application of a particular bias to change the characteristics of the transistor after fabrication. For example, one or more contacts could be formed to one or more of the conductive structures 130 in a manner similar to (e.g., in the same manner as) the formation of contacts 160 to receive the bias potential. Each conductive structure 130 may be configured to receive the same bias potential, or they may receive independent bias potentials. Similarly, one or more of the conductive structures 130 may be electrically floating while one or more other conductive structures 130 are configured to receive a bias potential.

While the transistor of FIG. 1G is depicted to be symmetrical, the device need not be. For example, the conductive structure 130 on one side of the control gate 125 may be a different width (i.e., larger or smaller) than the conductive structure 130 on the other side of the control gate 125, or it may be eliminated entirely. Similarly, the distance between the control gate 125 and the source/drain region 150 on one side of the control gate 125 may be different (i.e., longer or shorter) than the distance between the control gate 125 and the source/drain region 150 on the other side of the control gate.

Even for embodiments where one or more of the conductive structures 130 are electrically floating, inherent capacitive coupling between a particular conductive structure 130 and adjacent biased structures, such as the control gate 125, a contact 160 or another conductive structure, may induce a potential on that particular conductive structure 130. This could, in turn, result in capacitive coupling between the particular conductive structure 130 and a drain extension region 165, thereby altering the effective conductivity level of that drain extension region 165. To reduce such an effect, additional conductive structures 130 could be utilized, i.e., more than one conductive structure 130 between the control gate 125 and one of the source/drain regions 150.

Figure 2A:
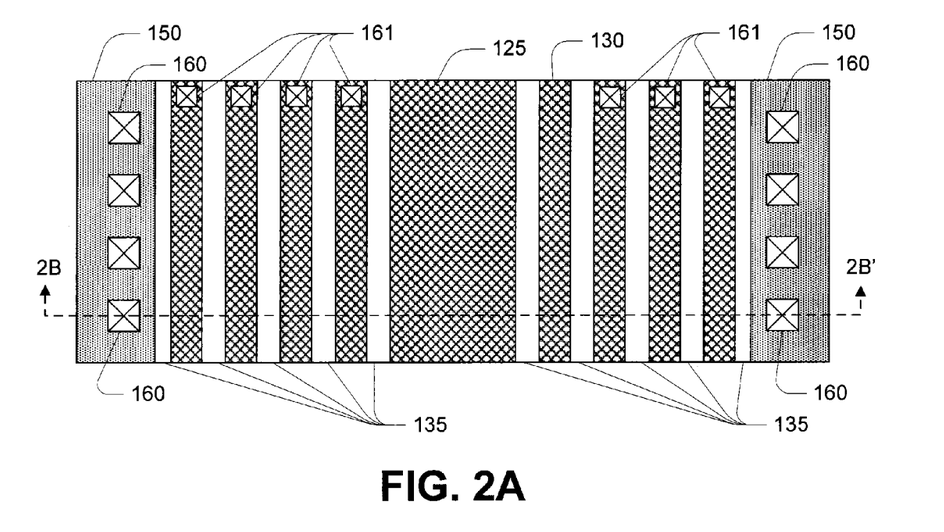
FIG. 2A is a top view of a transistor in accordance with another embodiment of the disclosure.
Figure 2B:
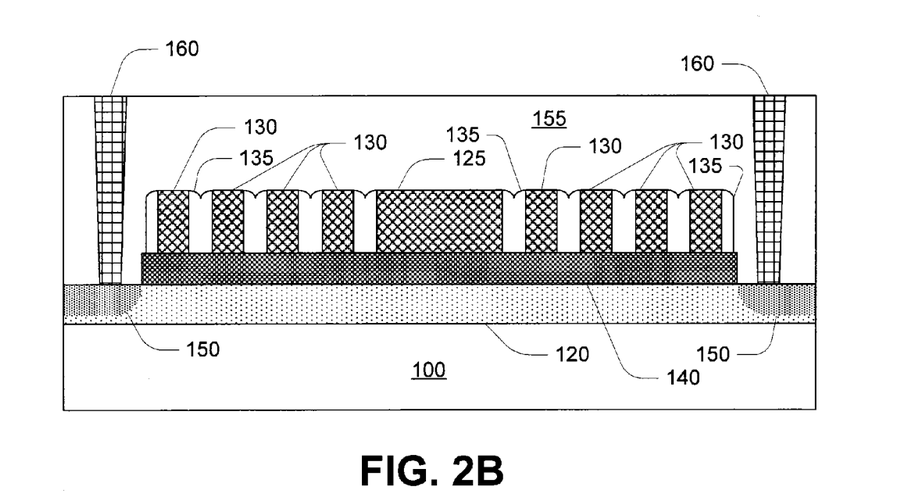
FIG. 2B is a cross-sectional view of the transistor of FIG. 2A.

FIG. 2A is a top view of a transistor in accordance with another embodiment of the disclosure. FIG. 2B is a cross-sectional view of the transistor of FIG. 2A taken along line 2B-2B' of FIG. 2A. In the example of FIGS. 2A-2B, more than one conductive structure 130 is formed between the control gate 125 and the source/drain regions 150. Formation of the structure of FIGS. 2A-2B will be apparent from the fabrication described with reference to FIGS. 1A-1G. In particular, for the example depicted in FIGS. 2A-2B, the conductor 110 would be patterned to define more than one conductive structure 130 on each side of the control gate 125, while the rest of the processing could remain the same. By utilizing additional conductive structures 130 over a drain extension region 165, capacitive coupling effects can be reduced because the voltage drop between adjacent structures would be reduced compared to using a single conductive structure 130 between the control gate 125 and a contact 160. In addition, for embodiments where one or more conductive structures 130 are configured to receive a bias potential, the use of additional conductive structures 130 can provide more flexibility for altering the characteristics of the transistor. Note that FIG. 2A depicts one or more conductive structures 130 configured to receive a bias potential, such as through contacts 161. Note further that not all conductive structures 130 of this example embodiment are configured to receive a bias potential. Contacts 161 may each be coupled to receive the same bias potential, or one or more contacts 161 may be coupled to receive a different bias potential than one or more other contacts 161.

Figure 3A:
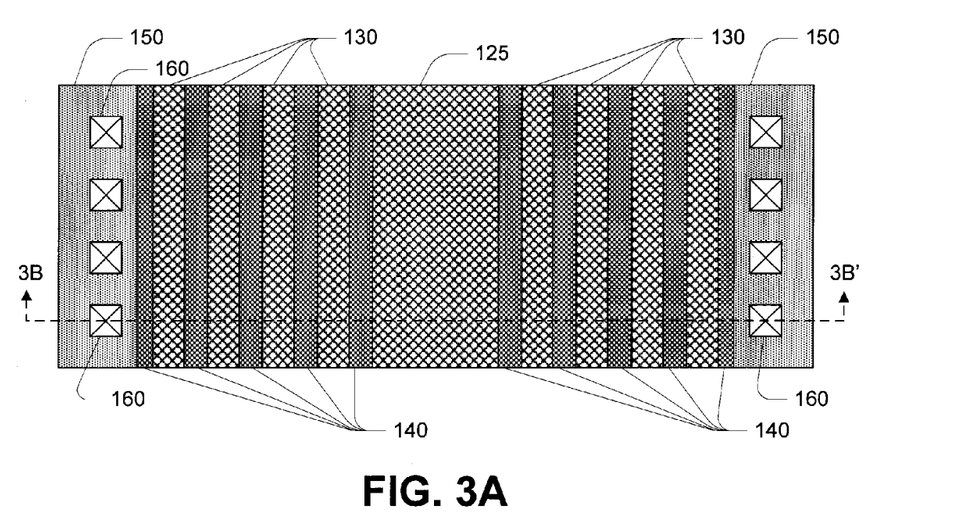
FIG. 3A is a top view of a transistor in accordance with another embodiment of the disclosure.
Figure 3B:
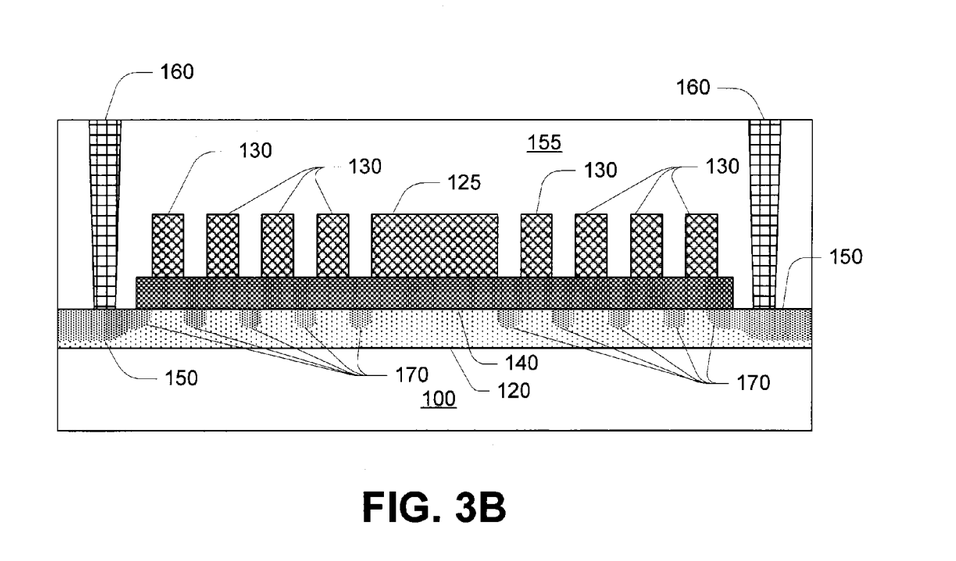
FIG. 3B is a cross-sectional view of the transistor of FIG. 3A.

While prior embodiments utilized spacers 135 to block dopant species 145 from penetrating into the body 120, alternate embodiments may eliminate the spacers 135. FIGS. 3A and 3B provide an example of such an embodiment. FIG. 3A is a top view of a transistor in accordance with such an embodiment of the disclosure. FIG. 3B is a cross-sectional view of the transistor of FIG. 3A taken along line 3B-3B' of FIG. 3A. In the example of FIGS. 3A-3B, processing could proceed as described with reference to FIGS. 2A-2B, except that the processing described with reference to FIG. 1D could be eliminated such that spacers 135 are not formed. Even though spacers 135 are not present in the example embodiment of FIGS. 3A-3B, penetration of dopant species 145 into the body 120 could be inhibited by selecting an angle of the implantation of the dopant species 145 such that the dopant species 145 would be blocked from reaching the body 120 by sidewalls of the control gate 125 or conductive structures 130.

Alternatively, as represented in the example of FIGS. 3A-3B, the angle of the implantation of the dopant species 145 could be selected to permit at least some of the dopant species 145 to reach the body 120, thereby forming doped regions in the body 120, referred to herein as conductive stripes 170. The conductive stripes 170 have the same conductivity type as the source/drain regions 150. For some embodiments, the conductive stripes 170 have the same conductivity level as the source/drain regions 150. For other embodiments, the conductive stripes 170 have a conductivity level equal to or greater than the body 120, and equal to or less than the source/drain regions 150. In general, as the angle of implantation of the dopant species 145 becomes steeper, i.e., as the angle of implantation approaches an angle perpendicular to the upper surface of the semiconductor 100, the resulting conductivity level of the conductive stripes 170 becomes closer to the resulting conductivity level of the source/drain regions 150. This ability to alter the angle of implantation of the dopant species 145, with embodiments lacking spacers 135, provides additional control over the resulting characteristics of the transistor. Note that there may be one more conductive stripe 170 between the control gate 125 and a source/drain region 150 than there are conductive structures 130 between the control gate 125 and that source/drain region 150, and that a conductive stripe 170 may merge with the source/drain region 150. Although not shown in FIG. 3B, it is noted that spacers 135 could alternatively be formed after formation of the conductive stripes 170. It is also noted that conductive stripes 170 could also be formed in embodiments having spacers 135 by separating the conductive structures 130 and/or control gate 125 by a sufficient distance (e.g., greater than two times a thickness of the spacers 135) such that the anisotropic removal during formation of spacers 135 (see discussion of FIG. 1D) would expose a portion of the gate dielectric 140 between the control gate 125 and one or more adjacent conductive structures 130, and/or between adjacent conductive structures 130, while leaving spacers 135 on the sidewalls of these elements.

Figure 4A:
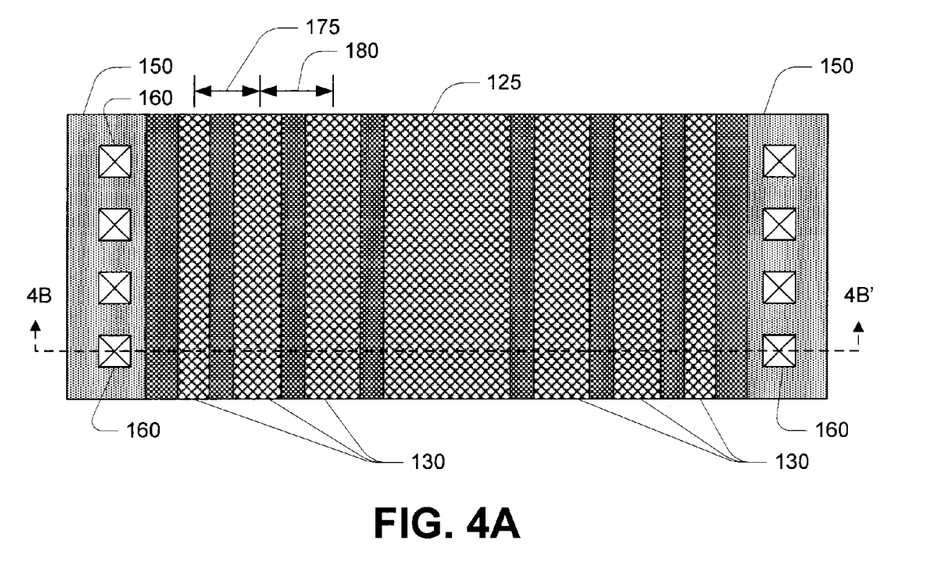
FIG. 4A is a top view of a transistor in accordance with another embodiment of the disclosure.
Figure 4B:
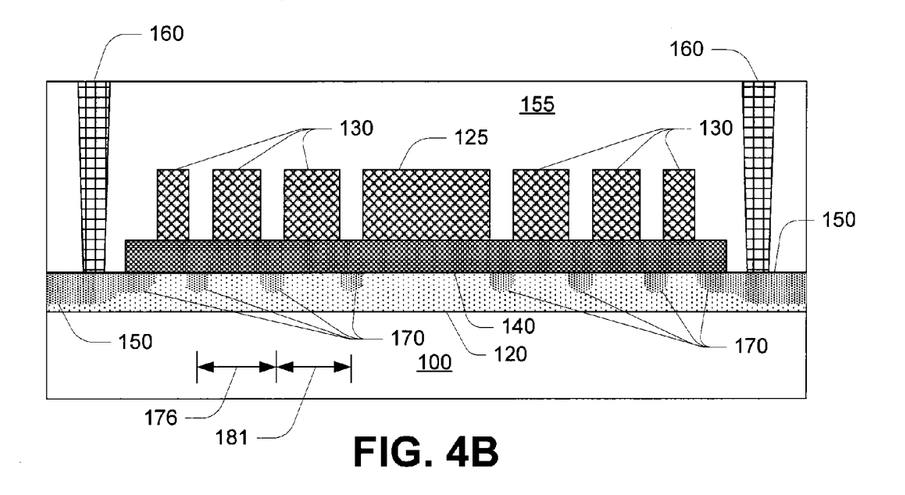
FIG. 4B is a cross-sectional view of the transistor of FIG. 4A.

While embodiments depicted in previous figures have used substantially equal (e.g., equal) spacing of the conductive structures 130, one or more embodiments can utilize spacing that varies between the control gate 125 and a source/drain region 150. FIGS. 4A-4B depict an embodiment using unequal spacing of conductive structures 130. FIG. 4A is a top view of a transistor in accordance with such an embodiment of the disclosure. FIG. 4B is a cross-sectional view of the transistor of FIG. 4A taken along line 4B-4B' of FIG. 4A. In the example of FIGS. 4A-4B, processing could proceed as described with reference to FIGS. 3A-3B with the exception of changing the pattern of the conductive structures 130.

Figure 5A:
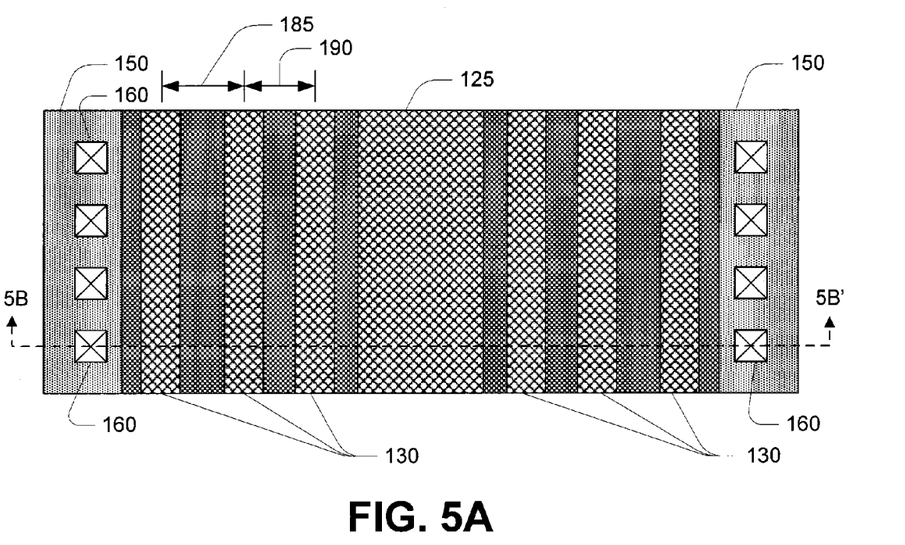
FIG. 5A is a top view of a transistor in accordance with another embodiment of the disclosure.
Figure 5B:
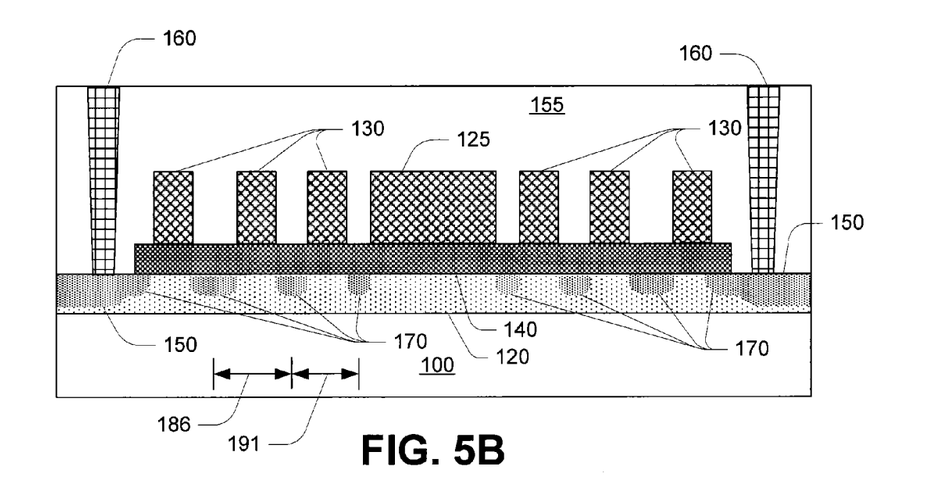
FIG. 5B is a cross-sectional view of the transistor of FIG. 5A.

As shown in FIG. 4A, the spacing 175 of an adjacent pair of conductive structures 130 is different (e.g., smaller in this example) than the spacing 180 of another adjacent pair of conductive structures 130. As used herein, the term spacing shall refer to a center-to-center distance. Thus, different spacing can be achieved by using conductive structures 130 of different widths with equal distance between sidewalls of adjacent conductive structures 130 (e.g., as depicted in FIGS. 4A-4B), by using conductive structures 130 of equal widths with different distance between sidewalls of adjacent conductive structures 130 (e.g., as depicted in FIGS. 5A-5B), or by using some combination thereof.

It is believed that higher effective conductivity levels near the source/drain regions and lower effective conductivity levels near the control gate 125 will lead to improved operational characteristics of the transistor, such as higher breakdown voltages for example. While this can be achieved by applying lower biases to conductive structures 130 near the control gate 125 and higher biases to conductive structures 130 near a source/drain region, this can also be achieved by having tighter spacing of conductive stripes 170 as you approach a source/drain region 150. As shown in FIGS. 4A-4B, spacing 176 between two adjacent conductive stripes 170 nearer the source/drain region 150 is less than the spacing 181 between another two adjacent conductive stripes 170 nearer the control gate 125. The embodiment depicted in FIGS. 4A-4B accomplishes this by reducing the spacing of conductive structures 130 nearer the source/drain regions 150, e.g., spacing 175 is less than spacing 180.

As noted above, FIGS. 5A-5B depict another embodiment using unequal spacing of conductive structures 130. While the example of FIGS. 4A-4B depicted tighter spacing of conductive stripes 170 nearer the source/drain regions 150, the example of FIG. 5A-5B achieves a higher effective conductivity level nearer the source/drain regions 150 by using conductive structures 130 of substantially equal (e.g., equal) width with greater distance between sidewalls of adjacent conductive structures 130 nearer the source/drain regions (e.g., spacing 185 may be greater than spacing 190 in this example). The result, as depicted in FIG. 5B can be larger (i.e., wider) conductive stripes 170 nearer the source/drain regions 150. As further depicted in FIG. 5B, spacing 186 between two adjacent conductive stripes 170 nearer the source/drain region 150 may be greater than the spacing 191 between another two adjacent conductive stripes 170 nearer the control gate 125. However, due to the wider conductive stripes 170 nearer the source/drain regions 150, higher effective conductivity levels may still be obtained.

The examples as described with reference to FIGS. 1A-5B have shown a variety of alternative structures. However, the depicted examples were not meant to be exhaustive. For example, conductive structures 130 on one side of the control gate 125 may be configured to receive a bias potential while conductive structures 130 on the other side of the control gate 125 may be electrically floating, whether or not conductive stripes 170 are utilized. For another example, unequal spacing of conductive structures 130 on one side of the control gate 125 may utilize conductive structures 130 of different widths with equal distance between sidewalls of adjacent conductive structures 130 while unequal spacing of conductive structures 130 on the other side of the control gate 125 may utilize conductive structures 130 of equal widths with different distances between sidewalls of adjacent conductive structures 130. As a further example, spacing of conductive structures 130 can increase nearer the control gate 125. Other combinations of elements of depicted embodiments will be apparent to one skilled in the art.

It is also noted that while specific materials were described with reference to FIGS. 1A-5B, the embodiments are not limited to the example materials. Furthermore, additional layers may be also utilized in various embodiments beyond those described, such as barrier layers to inhibit diffusion between opposing layers, or adhesion layers to promote adhesion between opposing layers.

CONCLUSION

Transistors having a dielectric over a semiconductor, a control gate over the dielectric at a particular level, and one or more conductive structures over the dielectric at the particular level have been described. The one or more conductive structures can facilitate control of device characteristics of the transistor, by receiving a bias potential to act as a field plate during operation of the transistor, by acting as a mask to fully or partially inhibit penetration of a dopant species into a body of the transistor, or some combination thereof. The one or more conductive structures are between the control gate and at least one source/drain region of the transistor. The one or more conductive structures are electrically isolated from the control gate.

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A transistor, comprising:
a dielectric over a semiconductor;
a control gate over the dielectric at a particular level;
source/drain regions in the semiconductor, one of the source/drain regions on one side of the control gate and another of the source/drain regions on another side of the control gate;
two or more conductive structures over the dielectric at the particular level; and
a body in the semiconductor and under the dielectric, wherein the source/drain regions have a particular conductivity type and the body has the particular conductivity type;
wherein at least one of the two or more conductive structures is between the control gate and at least one of the source/drain regions;
wherein the two or more conductive structures are electrically isolated from the control gate; and
wherein the control gate and the two or more conductive structures are formed on a same preceding structure or are formed concurrently.

2. The transistor of claim 1, further comprising two or more conductive stripes in the body, wherein the conductive stripes have the particular conductivity type.

3. The transistor of claim 2, wherein a conductivity level of the conductive stripes is less than or equal to a conductivity level of the source/drain regions.

4. The transistor of claim 2, wherein a conductivity level of the body is less than the conductivity level of the source/drain regions.

5. A transistor, comprising:
a dielectric over a semiconductor;
a control gate over the dielectric at a particular level;
source/drain regions in the semiconductor, one of the source/drain regions on one side of the control gate and another of the source/drain regions on another side of the control gate; and
two or more conductive structures over the dielectric at the particular level;
wherein at least one of the two or more conductive structures is between the control gate and at least one of the source/drain regions;

wherein the two or more conductive structures are electrically isolated from the control gate;
wherein the control gate and the two or more conductive structures are formed on a same preceding structure or are formed concurrently; and
wherein at least one conductive structure of the two or more conductive structures is electrically floating.

6. The transistor of claim 5, wherein at least one conductive structure of the two or more conductive structures is configured to receive a bias potential.

7. A transistor, comprising:
a dielectric over a semiconductor;
a control gate over the dielectric at a particular level;
source/drain regions in the semiconductor, one of the source/drain regions on one side of the control gate and another of the source/drain regions on another side of the control gate;
two or more conductive structures over the dielectric at the particular level; and
a body in the semiconductor and under the dielectric, wherein the source/drain regions have a particular conductivity type and the body has the particular conductivity type;
wherein the two or more conductive structures are between the control gate and only one of the source/drain regions; and
wherein the two or more conductive structures are electrically isolated from the control gate.

8. The transistor of claim 1, further comprising a spacer between the control gate and an adjacent one of the two or more conductive structures.

9. The transistor of claim 8, wherein the spacer comprises one or more dielectric materials.

10. A transistor, comprising:
a dielectric over a semiconductor;
a control gate over the dielectric at a particular level;
source/drain regions in the semiconductor, one of the source/drain regions on one side of the control gate and another of the source/drain regions on another side of the control gate;
two or more conductive structures over the dielectric at the particular level; and
an extension region in the semiconductor between the control gate and one of the source/drain regions, wherein the extension region has a conductivity level less than a conductivity level of the one of the source/drain regions;
wherein at least one of the two or more conductive structures is between the control gate and at least one of the source/drain regions;
wherein the two or more conductive structures are electrically isolated from the control gate; and
wherein the control gate and the two or more conductive structures are formed on a same preceding structure or are formed concurrently.

11. A transistor, comprising:
a dielectric over a semiconductor;
a control gate over the dielectric at a particular level;
source/drain regions in the semiconductor, one of the source/drain regions on one side of the control gate and another of the source/drain regions on another side of the control gate;
two or more conductive structures over the dielectric at the particular level; and
a body in the semiconductor and under the dielectric, wherein the source/drain regions have a particular conductivity type and the body has the particular conductivity type;
wherein at least one of the two or more conductive structures is between the control gate and at least one of the source/drain regions;
wherein the two or more conductive structures are electrically isolated from the control gate;
wherein at least one of the two or more conductive structures is configured to receive a bias potential; and
wherein the control gate and the two or more conductive structures are formed on a same preceding structure or are formed concurrently.

12. The transistor of claim 11, wherein each of the two or more conductive structures is configured to receive a bias potential.

13. The transistor of claim 11, wherein at least one conductive structure of the two or more conductive structures is configured to receive a bias potential different than at least one other conductive structure of the two or more conductive structures.

14. The transistor of claim 11, wherein the two or more conductive structures are configured to receive the same bias potential.

15. The transistor of claim 11, further comprising a spacer between the control gate and an adjacent one of the two or more conductive structures.

16. The transistor of claim 11, further comprising an extension region in the in the body between the control gate and one of the source/drain regions, wherein the extension region has a conductivity level less than a conductivity level of the one of the source/drain regions.

17. A transistor, comprising:
a dielectric over a semiconductor;
a control gate over the dielectric at a particular level;
source/drain regions in the semiconductor, one of the source/drain regions on one side of the control gate and another of the source/drain regions on another side of the control gate; and
three or more conductive structures over the dielectric at the particular level;
wherein the three or more conductive structures are between the control gate and at least one of the source/drain regions;
wherein the three or more conductive structures are electrically isolated from the control gate; and
wherein a spacing of adjacent conductive structures of the three or more conductive structures varies between the control gate and the at least one of the source/drain regions.

18. The transistor of claim 17, wherein the spacing of adjacent conductive structures varies by utilizing conductive structures of equal widths with different distances between sidewalls of adjacent conductive structures.

19. The transistor of claim 18, wherein the spacing is greater nearer the control gate than it is nearer the at least one of the source/drain regions.

20. The transistor of claim 17, wherein the spacing of adjacent conductive structures varies by utilizing conductive structures of different widths with equal distances between sidewalls of adjacent conductive structures.

21. The transistor of claim 20, wherein the spacing is greater nearer the at least one of the source/drain regions than it is nearer the control gate.

22. The transistor of claim 17, wherein the spacing of adjacent conductive structures varies by utilizing conductive structures of different widths with different distances between sidewalls of adjacent conductive structures.

23. A transistor, comprising:
a dielectric over a semiconductor;

a control gate over the dielectric at a particular level;
two source/drain regions in the semiconductor-and having a particular conductivity type, one of the two source/drain regions on one side of the control gate and the other of the two source/drain regions on another side of the control gate;
one or more conductive structures over the dielectric at the particular level; and
one or more conductive stripes in the semiconductor and having the particular conductivity type;
wherein the one or more conductive structures are between the control gate and at least one of the source/drain regions;
wherein the one or more conductive structures are electrically isolated from the control gate;
wherein the one or more conductive stripes are between the control gate and at least one of the source/drain regions; and
wherein at least one of the one or more conductive stripes between the control gate and the at least one of the source/drain regions is separated from the at least one of the source/drain regions.

24. The transistor of claim 23, wherein the one or more conductive stripes have a conductivity level less than or equal to a conductivity level of the source/drain regions.

25. A transistor, comprising:
a dielectric over a semiconductor;
a control gate over the dielectric at a particular level;
two source/drain regions in the semiconductor and having a particular conductivity type, one of the two source/drain regions on one side of the control gate and the other of the two source/drain regions on another side of the control gate;
one or more conductive structures over the dielectric at the particular level; and
two or more conductive stripes in the semiconductor and having the particular conductivity type;
wherein the one or more conductive structures are between the control gate and at least one of the source/drain regions;
wherein the one or more conductive structures are electrically isolated from the control gate;
wherein the two or more conductive stripes are between the control gate and at least one of the source/drain regions;
wherein at least one conductive stripe of the two or more conductive stripes has a different width than a width of at least one other conductive stripe of the two or more conductive stripes.

26. The transistor of claim 25, wherein a first conductive stripe nearest the at least one of the source/drain regions has a larger width than a second conductive stripe nearest the control gate.

27. A transistor, comprising:
a dielectric over a semiconductor;
a control gate over the dielectric at a particular level;
two source/drain regions in the semiconductor and having a particular conductivity type, one of the two source/drain regions on one side of the control gate and the other of the two source/drain regions on another side of the control gate;
two or more conductive structures over the dielectric at the particular level; and
three or more conductive stripes in the semiconductor and having the particular conductivity type;
wherein the two or more conductive structures are between the control gate and at least one of the source/drain regions;
wherein the two or more conductive structures are electrically isolated from the control gate;
wherein the three or more conductive stripes are interposed between the control gate and at least one of the source/drain regions; and
wherein a spacing of adjacent conductive stripes of the three or more conductive stripes varies between the control gate and the at least one of the source/drain regions.

28. The transistor of claim 27, wherein the spacing of adjacent conductive stripes provides a higher effective conductivity level nearer the at least one of the source/drain regions than an effective conductivity level nearer the control gate.

29. A transistor, comprising:
a dielectric over a semiconductor;
a control gate over the dielectric at a particular level;
only two source/drain regions in the semiconductor, a first source/drain region of the only two source/drain regions on one side of the control gate and a second source/drain region of the only two source/drain regions on another side of the control gate; and
two or more conductive structures over the dielectric at the particular level;
wherein at least one of the two or more conductive structures is between the control gate and the first source/drain region;
wherein at least one other of the two or more conductive structures is between the control gate and the second source drain region; and
wherein the two or more conductive structures are electrically isolated from the control gate.

30. A transistor, comprising:
a dielectric over a semiconductor;
a control gate over the dielectric at a particular level;
source/drain regions in the semiconductor, a first source/drain region of source/drain regions on one side of the control gate and a second source/drain region of the source/drain regions on another side of the control gate; and
two or more conductive structures over the dielectric at the particular level;
wherein at least one of the two or more conductive structures is between the control gate and the first source/drain region of the source/drain regions;
wherein at least one other of the two or more conductive structures is between the control gate and the second source drain region of the source/drain regions;
wherein the two or more conductive structures are electrically isolated from the control gate; and
wherein the at least one of the two or more conductive structures between the control gate and the first source drain region and the at least one other of the two or more conductive structures between the control gate and the second source drain region each comprise two or more conductive structures.

31. A transistor, comprising:
a dielectric over a semiconductor;
a control gate over the dielectric at a particular level;
source/drain regions in the semiconductor, a first source/drain region of source/drain regions on one side of the control gate and a second source/drain region of the source/drain regions on another side of the control gate; and
two or more conductive structures over the dielectric at the particular level;

wherein at least one of the two or more conductive structures is between the control gate and the first source/drain region of the source/drain regions;

wherein at least one other of the two or more conductive structures is between the control gate and the second source drain region of the source/drain regions;

wherein the two or more conductive structures are electrically isolated from the control gate; and wherein the at least one of the two or more conductive structures between the control gate and the first source drain region comprises a different number of the two or more conductive structures than the at least one other of the two or more conductive structures between the control gate and the second source drain region.

32. A transistor, comprising:

a dielectric over a semiconductor;

a control gate over the dielectric at a particular level;

source/drain regions in the semiconductor, one of the source/drain regions on one side of the control gate and another of the source/drain regions on another side of the control gate; and two or more conductive structures over the dielectric at the particular level;

wherein at least one of the two or more conductive structures is between the control gate and at least one of the source/drain regions;

wherein the two or more conductive structures are electrically isolated from the control gate; and wherein the at least one of the two or more conductive structures between the control gate and the at least one of the source/drain regions comprises two or more conductive structures having different widths.

33. A transistor, comprising:

a dielectric over a semiconductor;

a control gate over the dielectric at a particular level;

source/drain regions in the semiconductor, one of the source/drain regions on one side of the control gate and another of the source/drain regions on another side of the control gate;

two or more conductive structures over the dielectric at the particular level; and a body in the semiconductor and under the dielectric, wherein the source/drain regions have a particular conductivity type and the body has the particular conductivity type;

wherein at least one of the two or more conductive structures is between the control gate and at least one of the source/drain regions;

wherein the two or more conductive structures are electrically isolated from the control gate;

wherein the control gate and the two or more conductive structures are formed on a same preceding structure or are formed concurrently;

wherein the at least one of the two or more conductive structures between the control gate and the at least one of the source/drain regions comprises two or more conductive structures having the same width.

* * * * *

UNITED STATES PATENT AND TRADEMARK OFFICE
CERTIFICATE OF CORRECTION

PATENT NO. : 8,969,928 B2  
APPLICATION NO. : 12/872814  
DATED : March 3, 2015  
INVENTOR(S) : Mike Smith et al.

Page 1 of 1

It is certified that error appears in the above-identified patent and that said Letters Patent is hereby corrected as shown below:

In the Claims

In column 9, line 46, in Claim 10, after "of" delete "the".

In column 10, line 26, in Claim 16, after "the" delete "in the".

In column 10, line 28, in Claim 16, after "of" delete "the".

In column 11, line 2, in Claim 23, delete "semiconductor-and" and insert -- semiconductor and --, therefor.

In column 12, line 30, in Claim 29, delete "source drain" and insert -- source/drain --, therefor.

In column 12, line 49, in Claim 30, delete "source drain" and insert -- source/drain --, therefor.

In column 12, lines 53-54, in Claim 30, delete "source drain" and insert -- source/drain --, therefor.

In column 12, line 56, in Claim 30, delete "source drain" and insert -- source/drain --, therefor.

In column 13, line 6, in Claim 31, delete "source drain" and insert -- source/drain --, therefor.

In column 13, lines 10-11, in Claim 31, delete "source drain" and insert -- source/drain --, therefor.

In column 13, line 14, in Claim 31, delete "source drain" and insert -- source/drain --, therefor.

Signed and Sealed this  
Twenty-first Day of July, 2015

Michelle K. Lee  
*Director of the United States Patent and Trademark Office*